(12) United States Patent
Hunter

(10) Patent No.: US 12,155,300 B2
(45) Date of Patent: Nov. 26, 2024

(54) INPUT DEPENDENT COMMON MODE BIASING

(71) Applicant: TEXAS INSTRUMENTS INCORPORATED, Dallas, TX (US)

(72) Inventor: Bradford Hunter, Spicewood, TX (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 269 days.

(21) Appl. No.: 17/829,246

(22) Filed: May 31, 2022

(65) Prior Publication Data
US 2023/0402918 A1    Dec. 14, 2023

(51) Int. Cl.
*H02M 3/07*     (2006.01)
*H03K 19/173*   (2006.01)

(52) U.S. Cl.
CPC ........ *H02M 3/078* (2021.05); *H03K 19/1737* (2013.01)

(58) Field of Classification Search
CPC .............................................. H02M 3/07–078
See application file for complete search history.

(56) References Cited

U.S. PATENT DOCUMENTS

| | | | | |
|---|---|---|---|---|
| 5,691,720 A * | 11/1997 | Wang | ................. | H03M 3/392 |
| | | | | 341/172 |
| 6,031,480 A * | 2/2000 | Soenen | ................. | H03K 5/249 |
| | | | | 341/161 |
| 6,611,163 B1 * | 8/2003 | Mukherjee | ............. | H03K 5/249 |
| | | | | 327/91 |
| 9,496,880 B1 * | 11/2016 | Yin | ...................... | H03L 7/0891 |

* cited by examiner

*Primary Examiner* — Peter M Novak
(74) *Attorney, Agent, or Firm* — Ray A. King; Frank D. Cimino

(57) ABSTRACT

A circuit includes a switched capacitor circuit and a voltage generator circuit. The switched capacitor circuit includes first, second, third, and fourth switches and first and second capacitors. The first capacitor has first and second terminals, the first terminal coupled to the first switch. The second capacitor has first and second terminals, the second terminal coupled to the second switch. The third switch has a terminal coupled to the second terminals of the first and second capacitors. The fourth switch has first and second terminals, the first terminal coupled the terminal of the third switch and to the second terminals of the first and second capacitors. The voltage generator circuit has an output coupled to the second terminal of the fourth switch and is configured to provide a common mode output bias voltage at the second terminal of the fourth switch responsive to a common mode input bias voltage.

18 Claims, 7 Drawing Sheets

INPUT DEPENDENT COMMON MODE BIASING

TECHNICAL FIELD

This disclosure relates to common mode biasing, and more particularly to input dependent common mode biasing of a circuit.

BACKGROUND

Some systems measure input voltages for data acquisition or feedback purposes. For example, relatively low input voltage measurements (e.g., less than 10 volts (V)) may be taken from input signals having large common mode input biases as compared to the input voltage measurement. In such systems, voltage measuring circuits, such as switched capacitor circuits, may be used to measure (sample) the input voltages while eliminating the common mode bias at the input. Sampling input voltages using a switched capacitor circuit can generate accurate measurements when integrated into a data acquisition system, such as an analog-to-digital converter (ADC).

SUMMARY

In an ADC, a sampled input voltage may be compared to a reference voltage for quantization, in which the reference voltage is a low voltage having a zero volt or substantially zero volt common mode reference bias (also referred to herein as a common mode reference bias voltage). Also, in some systems, a common node or terminal coupled to capacitors that are used to sample the input voltage and coupled to capacitors that are used to sample the reference voltage is set to a constant low voltage, which creates a much larger voltage drop across the capacitors used to sample the input voltage than across the capacitors used to sample the reference voltage. This difference in voltage drop causes input voltage measurement errors due at least in part to the voltage coefficient of the capacitors, which leads to a change in capacitance under applied DC voltages.

Disclosed examples may be used to reduce or eliminate such measurement errors. More particularly, a disclosed voltage generator circuit is configured to provide, to the common node or terminal of the sampling capacitors, a common mode output bias voltage that is based on, e.g., a function of, the common mode input bias (also referred to herein as a common mode input bias voltage). In a particular example, the common mode output bias voltage is half the common mode input bias voltage. Providing a common mode output bias voltage that is dynamically generated responsive to the common mode input bias voltage dynamically balances the voltage drop across the capacitors used to sample the input voltage and across the capacitors used to sample the reference voltage, thereby reducing or eliminating associated input voltage measurement errors.

In one example, a circuit includes a switched capacitor circuit and a voltage generator circuit. The switched capacitor circuit includes first, second, third, and fourth switches and first and second capacitors. The first capacitor has a first terminal coupled to the first switch and has a second terminal. The second capacitor has a respective first terminal coupled to the second switch and has a respective second terminal. The third switch has a respective first terminal coupled to the second terminals of the first and second capacitors and has a respective second terminal. The fourth switch has a respective first terminal coupled the first terminal of the third switch and to the second terminals of the first and second capacitors and has a respective second terminal. The voltage generator circuit has an output coupled to the second terminal of the fourth switch. The voltage generator circuit is configured to provide a common mode output bias voltage at the second terminal of the fourth switch responsive to a common mode input bias voltage at a terminal of the first switch.

In another example, a circuit includes a first capacitor having first and second terminals, a second capacitor having respective first and second terminals, and a voltage generator circuit having an output. The second terminals of the first and second capacitors are coupled together, in which the circuit is configured to receive an input voltage and a common mode input bias voltage at the first terminal of the first capacitor and to receive a reference voltage at the first terminal of the second capacitor. The output of the voltage generator circuit is coupled to the second terminals of the first and second capacitors. The voltage generator circuit is configured to provide a common mode output bias voltage at the second terminals of the first and second capacitors, in which the common mode output bias voltage is based on the common mode input bias voltage.

In another example, a system includes first and second battery cells, a multiplexer, and an ADC. The multiplexer has inputs coupled to the first and second battery cells and has outputs. The ADC includes a switched capacitor circuit, an integrator circuit, and a voltage generator circuit. The switched capacitor circuit includes a first capacitor having first and second terminals, first, second, third, fourth, firth, and sixth switches, and a second capacitor. The first and second switches are coupled between the outputs of the multiplexer and the first terminal of the first capacitor. The second capacitor has a respective first terminal coupled to the third and fourth switches and has a respective second terminal coupled to the second terminal of the first capacitor. The fifth switch has a respective first terminal coupled to the second terminals of the first and second capacitors and has a respective second terminal. The sixth switch has a respective first terminal coupled the first terminal of the fifth switch and coupled to the second terminals of the first and second capacitors, and the sixth switch has a respective second terminal. The integrator circuit includes an operational amplifier (op-amp) and a third capacitor. The op-amp has an input and an output, wherein the input of the op-amp is coupled to the second terminal of the fifth switch. The third capacitor is coupled between the input and the output of the op-amp. The generator circuit has a respective output coupled to the second terminal of the sixth switch. The voltage generator circuit is configured to provide a common mode output bias voltage at the second terminal of the sixth switch responsive to a common mode input bias voltage at a terminal of the first switch.

DETAILED DESCRIPTION OF EXAMPLE EMBODIMENTS

Figure 1:
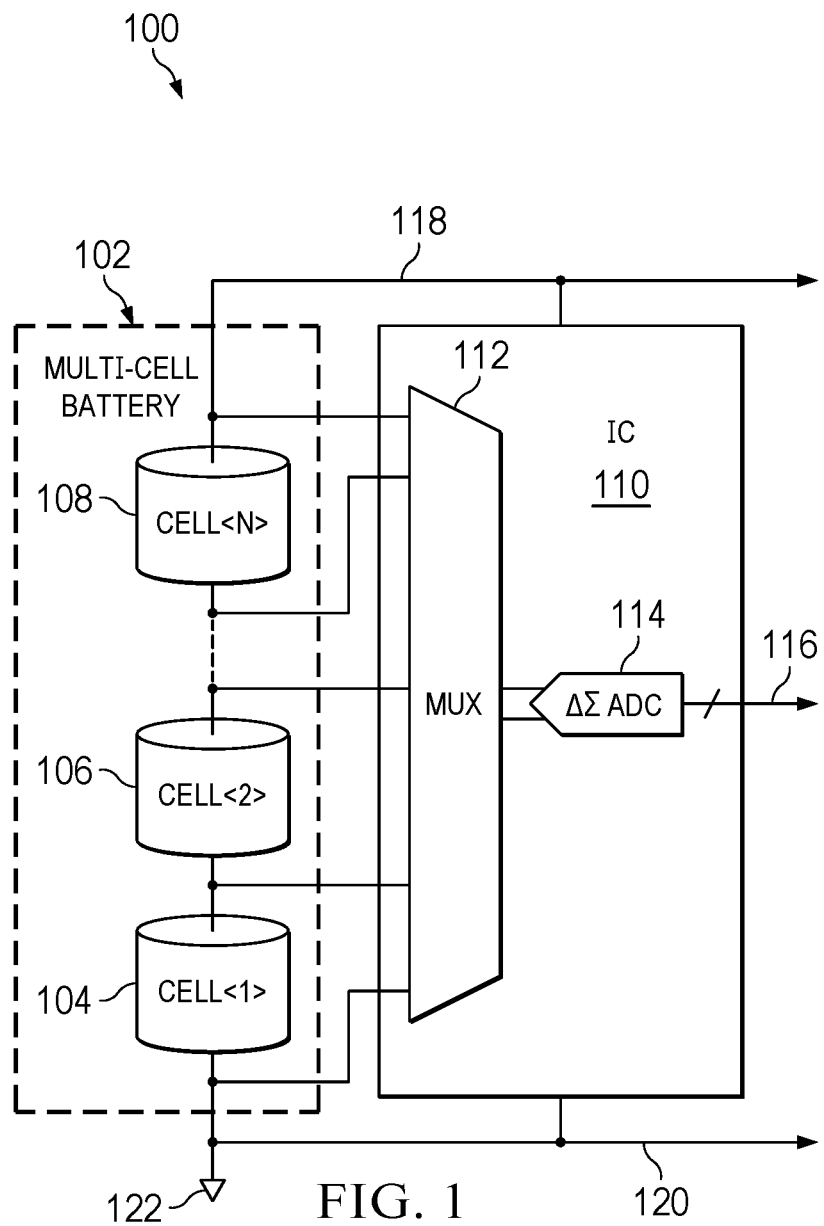
FIG. 1 depicts an example system that may implement input dependent common mode biasing.

Referring initially to FIG. 1, which depicts an example system 100 that may implement input dependent common mode biasing, according to the present disclosure. In one example, system 100 is a battery monitoring system. In other examples, the system is any type of power or voltage source or power supply monitoring system. As illustrated, system 100 includes a multicell battery pack 102 and an integrated circuit (IC) 110 that monitors the battery pack 102. Battery pack 102 and IC 110 are coupled to an upper voltage terminal 118 and a lower voltage terminal 120 of the system 100. In an example, system 100 is part of an IC package that may contain additional elements or components not shown. In this example, upper voltage terminal 118 is coupled to a first pin of the IC package that receives an upper voltage, and lower voltage terminal 120 is coupled to a second pin of the IC package that receives a lower voltage. For instance, the lower voltage terminal 120 is coupled to electrical ground 122.

Battery pack 102 includes multiple battery cells 1-N (labeled as 104, 106, and 108) coupled or stacked in series. One end (a top) of the stack of (battery) cells is coupled to the upper voltage terminal 118, and an opposite end (a bottom) of the stack of cells is coupled to the lower voltage terminal 120 and, thereby, to ground 122. Three battery cells are shown, but battery pack 102 can include more or fewer cells. In a particular example, battery pack 102 includes 25 4V battery cells, such that the top of the stack is at 100V.

IC 110 includes a multiplexer 112 and a delta-sigma ADC 114. The multiplexer 112 has inputs coupled to first and second terminals of each battery cell, and are accordingly referred to herein as battery voltage inputs. The multiplexer 112 has outputs coupled to inputs of the ADC 114. The ADC 114 has an output 116. In operation, the ADC 114 is multiplexed by the multiplexer 112 between battery cell voltages. More particularly, the ADC 114 measures differential battery cell voltages provided on the ADC 114 inputs. In an example, voltage measurements are taken by the ADC 114 in a loop that includes multiple measurement slots. At each slot, the multiplexer 112 provides a different pair of differential input voltages at the inputs of the ADC 114. The ADC 114 measures the differential voltages of all the cells 1-N on each loop and provides, for each measurement, a corresponding digital measurement signal having a certain bit resolution, e.g., 20 bits, at the output 116. The digital measurement signal may be provided to a digital signal processor (not shown).

Although not illustrated, the ADC 114 includes an analog modulator followed by digital decimation. Embodiments of the present disclosure may be implemented in the front end or first stage (first integrator stage) of the analog modulator. The front end stage of the analog modulator is also referred to herein as a switched capacitor integrator. In an example, the switched capacitor integrator includes a switched capacitor circuit that samples the differential input voltages, which the ADC converts to the digital measurement signal. In an alternative embodiment, the IC 110 includes a successive-approximation register (SAR) ADC, instead of the delta-sigma ADC. The SAR ADC includes a sample-and-hold circuit having capacitors used to acquire the input voltage. The sampling capacitors of the switched capacitor integrator and the sampling capacitors of the sample-and-hold circuit may be sensitive to the voltage coefficient problem.

A voltage generator circuit (not shown in FIG. 1), according to the present disclosure, may be coupled to the capacitors of the switched capacitor integrator or the capacitors of the sample-and-hold circuit. The voltage generator circuit may provide a common mode output bias voltage that is dynamically generated responsive to a common mode input bias voltage to dynamically balance the voltage drop across the capacitors used to sample the input voltage relative to the voltage drop across the capacitors used to sample a reference voltage.

Figure 2:
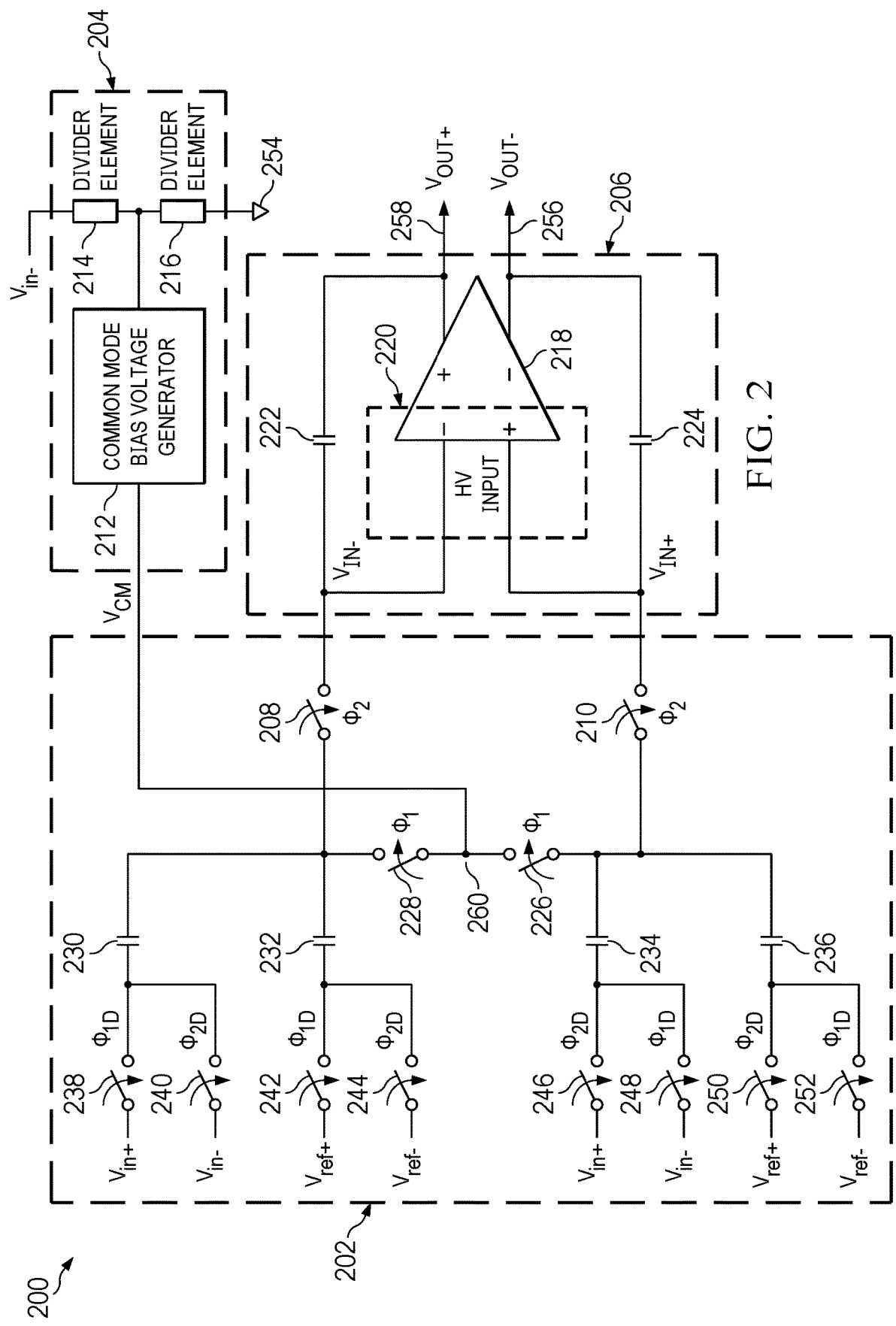
FIG. 2 depicts an example circuit that may be implemented in the system shown in FIG. 1 and that includes a voltage generator circuit for providing input dependent common mode biasing of a switched capacitor circuit.

FIG. 2 depicts an example circuit 200 that may be implemented in the system 100 shown in FIG. 1 and that includes a voltage generator circuit for providing input dependent common mode biasing of a switched capacitor circuit. For instance, circuit 200 is a switched capacitor integrator implemented as a front end or first stage of the analog modulator of ADC 114. As illustrated, circuit 200 includes a switched capacitor circuit 202, a voltage generator circuit 204, and an integrator circuit 206. Circuit 200, as illustrated, may be incorporated into an ADC having a differential input configuration. However, in another example, circuit 200 can be modified for incorporation into an ADC having a single-ended input configuration.

The switched capacitor circuit 202 includes capacitors 230, 232, 234, and 236 and switches 208, 210, 226, 228, 238, 240, 242, 244, 246, 248, 250, and 252 coupled together as shown via their respective first and second terminals. Terminals of capacitors may also be referred to herein as capacitor terminals. Terminals of switches may also be referred to herein as switch terminals. The first terminals of switches 238, 240, 246, and 248 are coupled to outputs of a multiplexer, e.g., the multiplexer 112, to receive differential input voltages $V_{in+}$ and $V_{in-}$, for instance differential battery voltages. Since the battery voltages are stacked, the differential battery voltages are superimposed onto a direct current (DC) common mode input bias voltage. In the example of the stacked battery cells, the differential input battery cell voltage is the difference between a higher voltage $V_{in+}$ at the top terminal of a cell having its battery voltage measured and a lower voltage $V_{in-}$ at the bottom terminal of the cell having its battery voltage measured. Also, the common mode input bias voltage is the voltage $V_{in-}$ at the bottom terminal of the battery cell. In a particular example, the voltage $V_{in+}$ is 100V at a top (first) terminal of a first battery cell. The voltage $V_{in-}$ is 95V at a bottom (second) terminal of the first battery cell. The differential battery cell voltage is 5V ($V_{in+}-V_{in-}$), and the common mode input bias voltage is or is substantially 95V ($V_{in-}$).

The first terminals of switches 242, 244, 250, and 252, are coupled to circuitry (not shown) that generates first and second reference voltages $V_{ref+}$ and $V_{ref-}$. In an example, $V_{ref+}$ is 1.2V and $V_{ref-}$ is 0V. Further to this example, $V_{ref+}$ and $V_{ref-}$ are not superimposed onto a DC voltage. Accordingly, the differential reference voltage is 1.2V ($V_{ref+}-V_{ref-}$), and the common mode reference bias voltage is or is substantially 0V.

Further to the connectivity of circuit elements of the switched capacitor circuit 202, the second terminals of the switches 238 and 240 are coupled to the first terminal of the capacitor 230. The second terminals of the switches 242 and 244 are coupled to the first terminal of the capacitor 232. The second terminals of the switches 246 and 248 are coupled to the first terminal of the capacitor 234. The second terminals of the switches 250 and 252 are coupled to the first terminal of the capacitor 236. The second terminals of the capacitors 230 and 232 are coupled to the first terminals of the switches 208 and 228. The second terminals of the capacitors 234 and 236 are coupled to the first terminals of the switches 210 and 226. The second terminals of switches 226 and 228 are coupled together at a common node 260. Responsive to switches 226 and 228 closing, the second terminals of capacitors 230, 232, 234, and 236 are coupled together at the common node 260.

Figure 3:
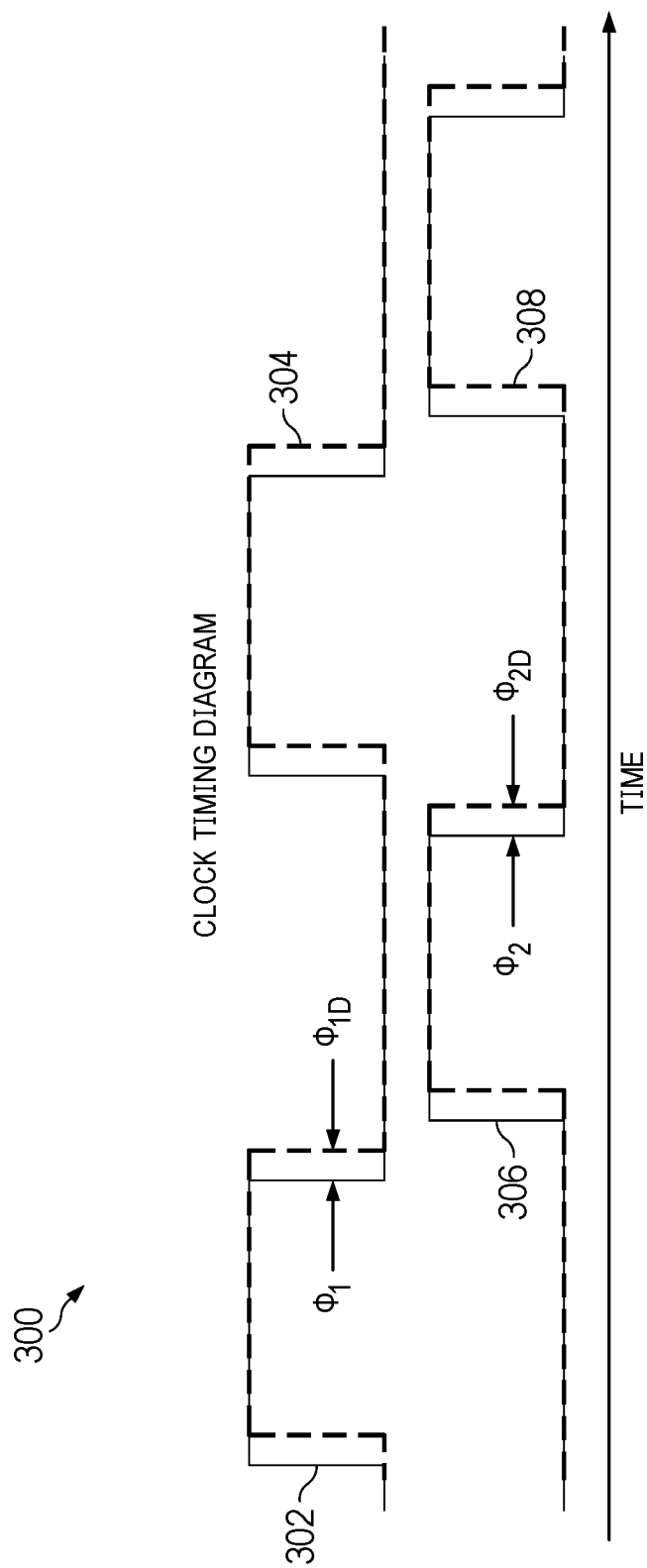
FIG. 3 depicts clock signals for driving switches in the circuit shown in FIG. 2.

In an example, switches 238, 240, 242, 244, 246, 248, 250, and 252 are each implemented as one or more transistors, such as one or more field-effect (FET) transistors or one or more bipolar junction transistors (BJTs). In an example, switches 208, 210, 226, and 228 are each implemented as the switch circuit shown in FIG. 6. Switches 226 and 228 are driven (opened and closed or otherwise controlled) using a clock signal $\Phi_1$. Switches 238, 242, 248, and 252 are driven using a clock signal $\Phi_{1D}$, which is a delayed version of clock signal $\Phi_1$. Switches 208 and 210 are driven using a clock signal $\Phi_2$. Switches 240, 244, 246, and 250 are driven using a clock signal $\Phi_{2D}$, which is a delayed version of clock signal $\Phi_2$. Clock signals $\Phi_1$, $\Phi_{1D}$, $\Phi_2$, and $\Phi_{2D}$ may be supplied by any suitable clock circuit (not shown). FIG. 3 depicts a clock timing diagram 300 illustrating example clock signals over time for driving switches 208, 210, 226, 228, 238, 240, 242, 244, 246, 248, 250, and 252. Namely, a signal 302 represents the clock signal $\Phi_1$. A signal 304 represents the clock signal $\Phi_{1D}$. A signal 306 represents the clock signal $\Phi_2$. A signal 308 represents the clock signal $\Phi_{2D}$.

The voltage generator circuit 204 includes first and second divider elements 214 and 216 and a common mode bias voltage generator circuit 212. The first and second divider elements 214 and 216 each have respective first and second terminals, and the circuit 212 has an input and an output. In an example, the divider elements 214 and 216 are switched capacitors (a switch coupled to a capacitor, with the switch being controlled by a clock signal), or the divider elements 214 and 216 are fixed resistors. The first terminal of the divider element 214 is coupled in a manner to receive the common mode input bias voltage, $V_{in-}$, which is associated with or corresponding to the differential voltage ($V_{in+}-V_{in-}$) being measured. For instance, the first terminal of the divider element 214 is coupled to an output of the multiplexer 112. Moreover, the second terminal of the divider element 214 is coupled to the first terminal of the divider element 216. The second terminal of the divider element 216 is coupled to an electrical ground 254. The input of the circuit 212 is coupled to the second terminal of the divider element 214 and is coupled to the first terminal of the divider element 216. The output of the circuit 212 is coupled to the common node 260. In an example, the voltage generator circuit 204 is implemented as the circuit shown in FIG. 5.

The integrator circuit 206 includes an operational amplifier (op-amp) 218 and capacitors 222 and 224. The capacitors 222 and 224 each have respective first and second terminals. The op-amp 218 has differential (first and second) inputs 220 and (first and second) outputs 258 and 256. The second terminal of the switch 208 is coupled to the first terminal of the capacitor 222 and to the first (negative) input of the op-amp 218. The second terminal of the switch 210 is coupled to the second terminal of the capacitor 224 and to the second (positive) input of the op-amp 218. The second terminal of the capacitor 222 is coupled to the first (positive) output 258 of the op-amp 218. The second terminal of the capacitor 224 is coupled to the second (negative) output 256 of the op-amp 218. In an example, the integrator circuit 206 is implemented as the circuit shown in FIG. 7, which includes a high voltage (HV) input circuit that may be used to implement the differential inputs 220 of the op-amp 218. For instance, a high voltage is greater than 10V.

During operation, f the circuit 200, responsive to the closing of the switches 208, 210, 226, 228, 238, 240, 242, 244, 246, 248, 250, and 252 under the control of their respective clock signals (e.g., according to the clock timing diagram 300 of FIG. 3), generates a differential voltage at outputs 258 and 256 that represents a scaled combination of the input voltage ($V_{in+}-V_{in-}$) and the reference voltage ($V_{ref+}-V_{ref-}$). In this manner the input voltage and reference voltage can accumulate at the outputs 258 and 256 (represented by $V_{OUT+}-V_{OUT-}$) and integrate over time. The polarity of the integration function can be controlled by a feedback term (not shown) to create a delta-sigma modulation function.

The common mode input bias voltage $V_{in-}$ (associated with or corresponding to the differential voltage being measured), is received at the first terminal of the divider element 214. The common mode input bias voltage is divided down by the divider elements 214 and 216, in which a divided common mode input bias voltage is provided at the input of the circuit 212. Responsive to receiving the divided common mode input bias voltage, the circuit 212 provides a common mode output bias voltage, $V_{CM}$, to the common node 260, in which $V_{CM}$ is based on, e.g., is a function of $V_{in-}$. For example, $V_{CM}$ is half of $V_{in-}$. Since $V_{CM}$ is dynamically generated responsive to or based on the current common mode input bias voltage $V_{in-}$, as opposed to being static, input voltage measurement errors due to the voltage coefficient of the capacitors is reduced or eliminated.

Figure 4:
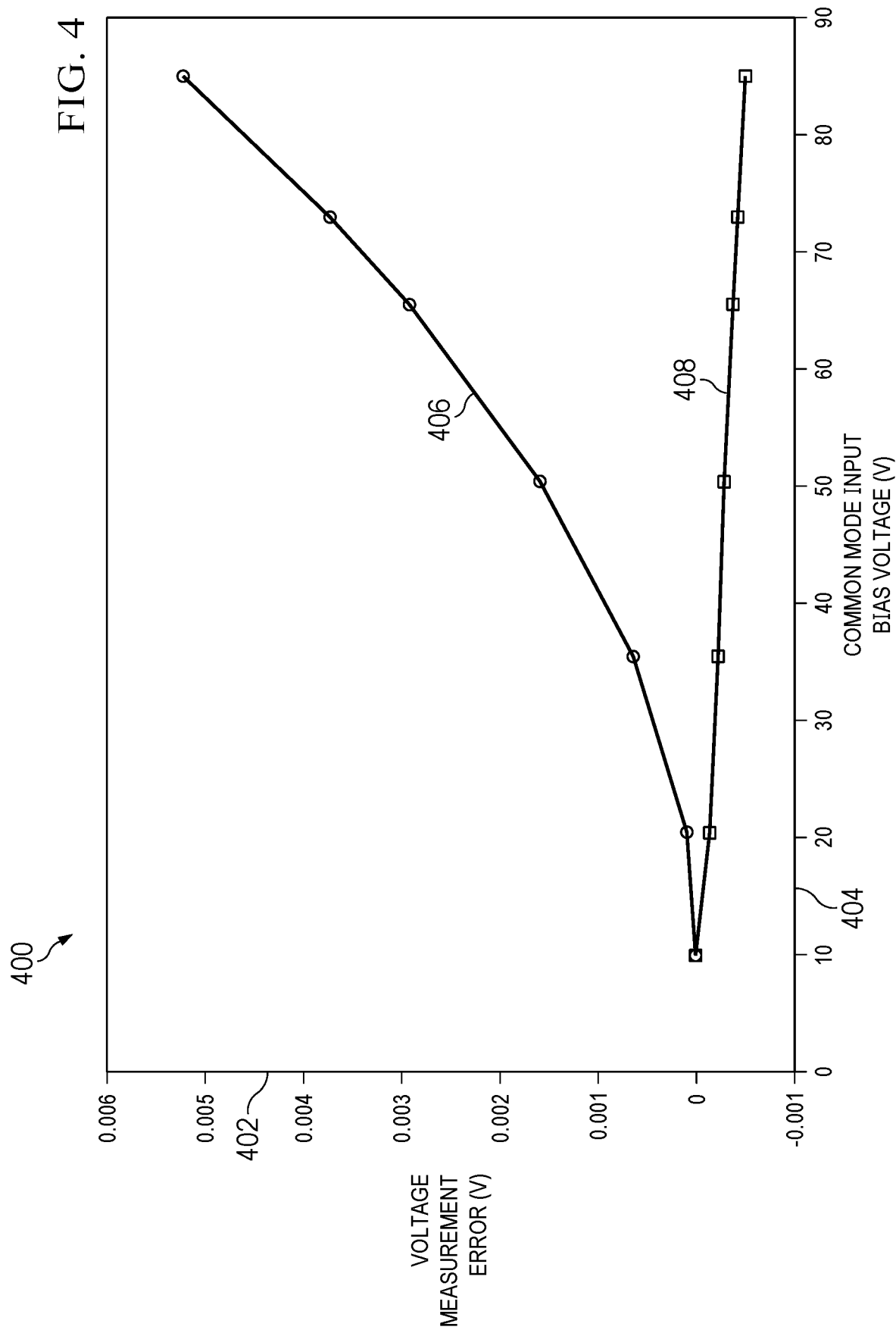
FIG. 4 depicts example curves illustrating input voltage measurement error versus common mode input bias voltage.

FIG. 4 depicts a diagram 400 including example curves 406 and 408 illustrating input voltage measurement error versus common mode input bias voltage. Voltage measurement error is shown along the Y axis 402 in volts, and common mode input bias voltage is shown along the X-axis 404 in volts. Curve 406 corresponds to a fixed common mode bias voltage, e.g., 0.6 V, being applied at the common node 260. Curve 408 corresponds to the voltage generator circuit 204 applying an adaptive or dynamic common mode output bias voltage $V_{CM}$ at the common node 260. As shown in curve 406, the input voltage measurement error is over 5 millivolts (mV) when an 80V common mode input bias voltage is present, which can cause significant issues in some systems. However, as reflected by curve 408, the input voltage measurement error is significantly reduced by the inclusion of the voltage generator circuit 204.

Figure 5:
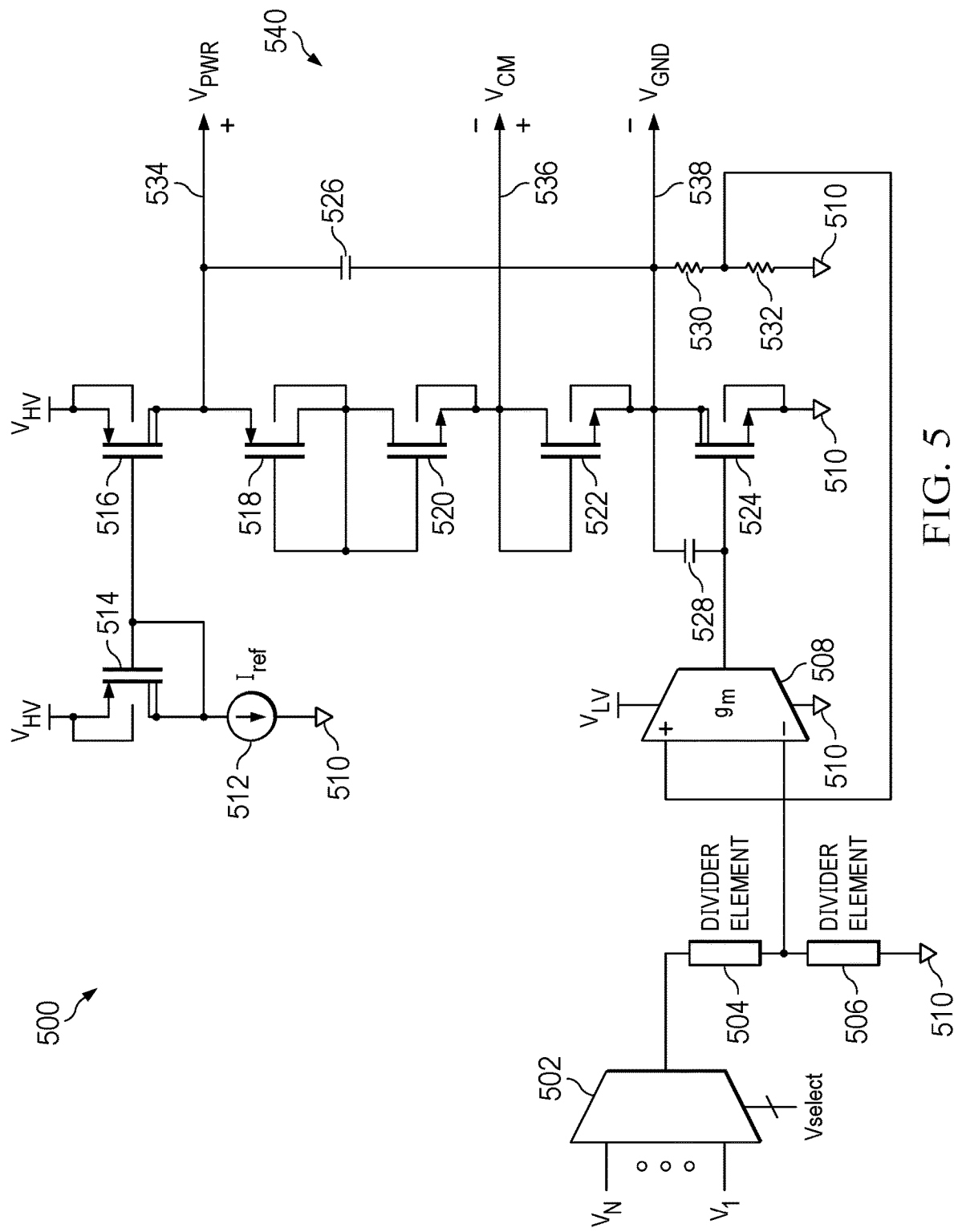
FIG. 5 depicts an example circuit for generating a common mode output bias voltage, which may be implemented in the circuit shown in FIG. 2.

FIG. 5 depicts an example circuit 500 for generating a common mode output bias voltage, which may be implemented in the circuit shown in FIG. 2. The voltage generator circuit 204 of FIG. 2 may be implemented as circuit 500. As shown, circuit 500 includes a multiplexer 502, first and second divider elements 504 and 506, and a common mode bias voltage generator circuit 540. However, in an alternative example, circuit 500 does not include the multiplexer 502. The first and second divider elements 504 and 506 each have respective first and second terminals, and the multiplexer 502 has inputs labeled 1 to N, another input labeled $V_{select}$, and an output. The divider elements 214 and 216 may be switched capacitors or fixed resistors.

In an example, the inputs 1 to N of the multiplexer 502 are coupled to the battery terminals of the cells of the multi-cell battery pack 102. The first terminal of the divider element 504 is coupled to the output of the multiplexer 502. The second terminal of the divider element 504 is coupled to the first terminal of the divider element 506. The second terminal of the divider element 506 is coupled to electrical ground 510. The $V_{select}$ input is used to control the selection one of the inputs 1 to N to provide, to the first terminal of the divider element 504, the common mode input bias voltage $V_{in-}$ associated with or corresponding to the differential voltage being measured.

The common mode bias voltage generator circuit 540 includes a (transconductance) amplifier 508 having a transconductance $g_m$, a current source 512 providing a current $I_{ref}$, transistors 514, 516, 518, 520, 522, and 524, capacitors 526 and 528, and resistors 530 and 532. Amplifier 508 has a first (positive) input, a second (negative) input, power supply lines, and an output. The current source 512, capacitors 526 and 528, and resistors 530 and 532 each have respective first and second terminals. The transistors 514, 516, 518, 520, 522, and 524 are FETs, each having respective first and second terminals (source and drain) and a respective control terminal (gate). Terminals of resistors may also be referred to herein as resistor terminals. Terminals of a current source may also be referred to herein as current source terminals. Terminals of transistors may also be referred to herein as transistor terminals.

In this particular example, transistors 514, 516, and 518 are P-channel metal-oxide-semiconductor field-effect transistors (MOSFETS), and transistors 520, 522, and 524 are N-channel MOSFETS. Also, transistors 514, 516, and 524 are drain-extended transistors that can withstand higher voltages than transistors 518, 520, and 522.

As illustrated, the negative input of amplifier 508 is coupled to the second terminal of the divider element 504 and to the first terminal of the divider element 506. One of the power supply lines of the amplifier 508 is coupled to a power supply that provides a voltage $V_{LV}$, e.g., 5V, and the other power supply line is coupled to electrical ground 510. The transistor 514 is diode-connected between the current source 512 and a power supply that provides a voltage $V_{HV}$, e.g., 100V. Namely, the source of transistor 514 is coupled to the power supply that provides $V_{HV}$, and the drain and gate of the transistor 514 are coupled together and to the first terminal of the current source 512 and the gate of the transistor 516. The second terminal of the current source 512 is coupled to ground 510.

The source of the transistor 516 is coupled to the power supply that provides $V_{HV}$. The drain of the transistor 516 is coupled to the source of the transistor 518 and the first terminal of the capacitor 526, from which is defined or extends a first output 534 of the common mode bias voltage generator circuit 540. Transistors 518, 520, and 522 are diode-connected in series between the transistor 516 and the transistor 524, Namely, the gate and drain of transistor 518 are coupled to the gate and drain of transistor 520. The source of transistor 520 is coupled to the gate and drain of transistor 522, from which is defined or extends a second output 536 of the common mode bias voltage generator circuit 540. The source of the transistor 522 is coupled to the drain of the transistor 524, the first terminal of the capacitor 528, the second terminal of the capacitor 526, and the first terminal of the resistor 530, from which is defined or extends a third output 538 of the common mode bias voltage generator circuit 540. The second terminal of the capacitor 528 is coupled to the output of the amplifier 508 and to the gate of the transistor 524. The source of the transistor 524 is coupled to ground 510. The second terminal of the resistor 530 is coupled to the first terminal of the resistor 532 and to the positive input of the amplifier 508. The second terminal of the resistor 532 is coupled to ground 510.

A first voltage $V_{PWR}$ is provided at the output 534. The common mode output bias voltage $V_{CM}$ is provided at the output 536. A second voltage $V_{GND}$ is provided at the output 538. As illustrated, $V_{PWR}$ is two diode drop voltages above $V_{CM}$, and $V_{GND}$ is one diode drop voltage below $V_{CM}$. A diode drop voltage, in this case, is the voltage drop between the source and drain of a diode-connected transistor, e.g., about 0.6V. Also, $V_{CM}$ is about half of the common mode input bias voltage $V_{in-}$ associated with or corresponding to the differential voltage being measured.

During operation of the circuit 500, the selected input voltage from multiplexer 502 is continually monitored and buffered to provide a voltage divided representation of the selected input voltage at the output $V_{CM}$ (536). The term buffered is used to describe the operation of transforming a high impedance voltage at the (common terminal) output of the (voltage) divider elements 504 and 506 to low impedance voltages $V_{PWR}$, $V_{CM}$, and $V_{GND}$ respectively at the outputs 534, 536, and 538 of the circuit 540. Other circuit implementations can be used such that the circuit 540 is configured to receive a divided common mode input bias voltage (at the common terminal of the of the divider elements 504 and 506) and to provide a buffered and lower impedance representation of the divided common mode input bias voltage as the common mode output bias voltage $V_{CM}$ and the accompanying voltages $V_{PWR}$ and $V_{GND}$.

Figure 6:
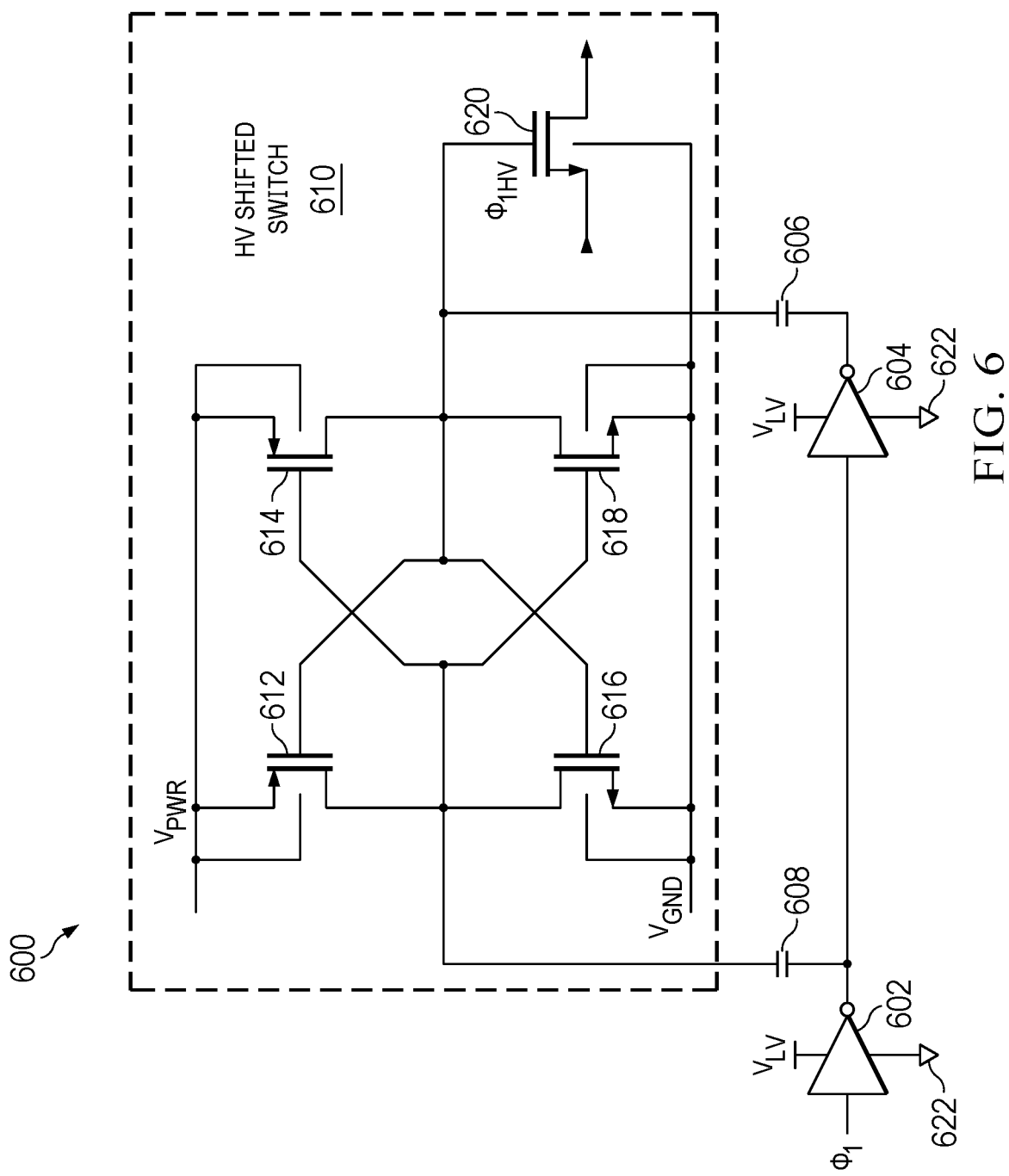
FIG. 6 depicts an example high-voltage switch circuit that may be implemented in the circuit shown in FIG. 2.

FIG. 6 depicts an example high-voltage switch circuit 600 that may be implemented in the circuit shown in FIG. 2. Any one or each of the switches 208, 210, 226, and 228 of FIG. 2 may be implemented as circuit 600. As shown, circuit 600 includes an inverter 602, an inverter 604, capacitors 606 and 608, and a high voltage shifted switch 610. Inverters 602 and 604 each have a respective input, a respective output, and first and second power supply lines. Capacitors 606 and 608 have respective first and second terminals.

The input of the inverter 602 is coupled to a clock circuit (not shown) to receive a clock signal, e.g., $\Phi_1$ or $\Phi_2$ depending on where the switch circuit is coupled within circuit 200. The output of the inverter 602 is coupled to the input of the inverter 604 and to the first terminal of the capacitor 608. The output of the inverter 604 is coupled to the first terminal of the capacitor 606. One power supply line of each of the inverter 602 and the inverter 604 is coupled to a power supply that provides a voltage $V_{LV}$, e.g., 5V. The other power supply line of each of the inverter 602 and the inverter 604 is coupled to electrical ground 622.

The high voltage shifted switch 610 includes transistors 612, 614, 616, 618, and 620. In this particular example, transistors 612 and 614 are P-channel MOSFETS, and transistors 616, 618, and 620 are N-channel MOSFETS. Also, since the transistors 612, 614, 616, 618, and 620 are powered by a voltage domain of about 1.8V (e.g., $V_{PWR}$ - $V_{GND}$), none of these transistors need to be drain-extended transistors. As illustrated, the sources of transistors 612 and 614 are coupled together and to the output 534 to receive $V_{PWR}$. The gate of the transistor 612 is coupled to the gate of the transistor 616, to the drains of the transistors 614 and 618, to the second terminal of the capacitor 606, and to the gate of the transistor 620. An example clock signal $\Phi_{1HV}$ derived or provided responsive to the clock signal $\Phi_1$ (or an example clock signal $\Phi_{2HV}$ derived or provided responsive to the clock signal $\Phi_2$) is provided to the gate of the transistor 620.

The gate of the transistor 614 is coupled to the gate of the transistor 618, to the drains of the transistors 612 and 616, and to the second terminal of the capacitor 608. The sources of the transistors 616 and 618 are coupled together and coupled to the output 538 to receive $V_{GND}$. The transistor 620 serves as the switching transistor. For example, where circuit 600 is implemented as the switch 208 of FIG. 2, the source of the transistor 620 is coupled to the second terminals of the capacitors 230 and 232, and the drain of the transistor 620 is coupled to the first terminal of the capacitor 222 and coupled to the negative input of the op-amp 218.

During operation of the circuit 600, the common mode voltage $V_{CM}$ (536) can be selected when the switch 620 is closed and unselected when the switch 620 is open. In this way, the low voltage switch 620 is connected to a high voltage source ($V_{CM}$) and effectively AC coupled to the low voltage clock sources $\Phi_1$ or $\Phi_2$. In combination, the circuitry creates an effective high voltage switch (610) using only high voltage capacitors (608 and 606).

Figure 7:
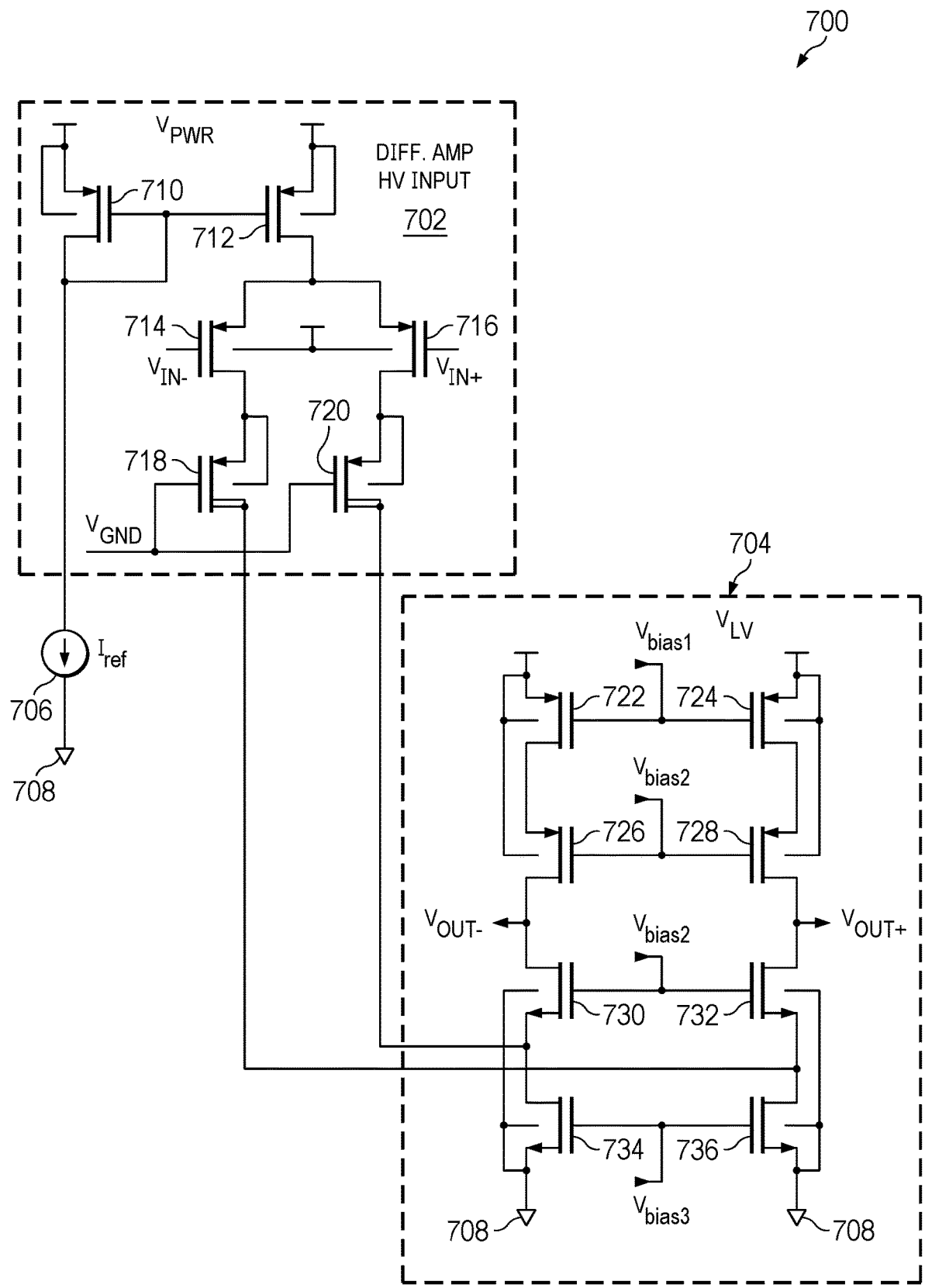
FIG. 7 depicts an example differential amplifier circuit with a high-voltage input that may be implemented in the circuit shown in FIG. 2.

FIG. 7 depicts an example integrator amplifier circuit 700 including a differential amplifier circuit 704 having as its differential inputs a high-voltage input circuit 702, which may be implemented in the circuit shown in FIG. 2. Circuit 700 further includes a current source 706 that has first and second terminals and that generates a current $I_{ref}$. For instance, circuit 700 represents part of an integrator circuit (but without the capacitors), such as the integrator circuit 206. In this example, op-amp 218 having differential inputs 220 is implemented as differential amplifier 704 having the circuit 702 as its differential inputs.

As illustrated, the first terminal of the current source 706 is coupled to electrical ground 708. The high-voltage input circuit 702 includes transistors 710, 712, 714, 716, 718, and 720. The differential amplifier 704 includes transistors 722, 724, 726, 728, 730, 732, 734, and 736. As shown, all the transistors 710-720 of the circuit 702 are P-channel MOSFETs, with the transistors 718 and 720 being drain-extended transistors. Transistors 722-728 of the circuit 704 are P-channel MOSFETs, and transistors 730-736 of the circuit 704 are N-channel MOSFETs.

As illustrated for the circuit 702, the sources of the transistors 710 and 712 are coupled to a power supply that provides a voltage $V_{PWR}$, for instance to the output 534 of circuit 500. The gate of the transistor 710 is coupled to the drain of the transistor 710, to the second terminal of the current source 706, and to the gate of the transistor 712. The drain of transistor 712 is coupled to the sources of transistors 714 and 716. The gate of the transistor 714 is coupled to the second terminal of the switch 208 to receive $V_{IN-}$. The gate of the transistor 716 is coupled to the second terminal of the switch 210 to receive $V_{IN+}$. The integrator amplifier 700 operates in a closed feedback loop to maintain the difference between $V_{IN+}-V_{IN-}$ at appreciably or substantially zero voltages. The drain of the transistor 714 is coupled to the source of the transistor 718, and the drain of the transistor 716 is coupled to the source of the transistor 720. The gates of the transistors 718 and 720 are coupled together and coupled to the output 538 to receive $V_{GND}$.

As illustrated for the circuit 704, sources of the transistors 722 and 724 are coupled to a power supply that provides a voltage $V_{LV}$, e.g., 2V. The gates of the transistors 722 and 724 are coupled together and are controlled or biased by a voltage $V_{bias1}$. The drain of the transistor 722 is coupled to the source of the transistor 726. The drain of the transistor 724 is coupled to the source of the transistor 728. The gates of the transistors 726 and 728 are coupled together and are controlled or biased by a voltage $V_{bias2}$. The drains of the transistors 726 and 730 are coupled together, at which a voltage $V_{OUT-}$ is provided. The drains of the transistors 728 and 732 are coupled together, at which a voltage $V_{OUT+}$ is provided. The integrator amplifier 700 operates in a closed feedback loop to maintain a difference voltage between $V_{OUT+}-V_{OUT-}$ to satisfy the requirement that $V_{IN+}-V_{IN-}$ equals to zero volts. The gates of the transistors 730 and 732 are coupled together and are controlled or biased by the voltage $V_{bias2}$. The source of the transistor 730 is coupled to the drains of the transistors 720 and 734. The source of the transistor 732 is coupled to the drains of the transistors 718 and 736. The gates of the transistors 734 and 736 are coupled together and are controlled or biased by the voltage $V_{bias3}$. The source of the transistor 734 is coupled to ground 708. The source of the transistor 736 is coupled to ground 708.

During operation of the circuit 700, the integration function of the delta-sigma modulation process is implemented. The fully differential amplifier 700 provides the active circuitry needed to perform the integration function described previously. The HV differential amplifier input 702 provides the necessary circuitry to interface the integrator amplifier 700 to the high voltage common mode $V_{CM}$ voltage level at the output 536.

In the description and in the claims, the terms "including" and "having" and variants thereof are intended to be inclusive in a manner similar to the term "comprising" unless otherwise noted. Unless otherwise stated, "about," "approximately," or "substantially" preceding a value means +/-10 percent of the stated value. In another example, "about," "approximately," or "substantially" preceding a value means +/-5 percent of the stated value. In another example, "about," "approximately," or "substantially" preceding a value means +/-1 percent of the stated value.

The term "couple", "coupled", "couples", and variants thereof, as used herein, may cover connections, communications, or signal paths that enable a functional relationship consistent with this description. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A. Moreover, the terms "couple", "coupled", "couples", or variants thereof, includes an indirect or direct electrical or mechanical connection.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

Although not all separately labeled in the FIGS., components or elements of systems and circuits illustrated therein have one or more conductors or terminus that allow signals into and/or out of the components or elements. The conductors or terminus (or parts thereof) may be referred to herein as pins, pads, terminals (including input terminals, output terminals, reference terminals, and ground terminals, for instance), inputs, outputs, nodes, and interconnects.

As used herein, a "terminal" of a component, device, system, circuit, integrated circuit, or other electronic or semiconductor component, generally refers to a conductor such as a wire, trace, pin, pad, or other connector or interconnect that enables the component, device, system, etc., to electrically and/or mechanically connect to another component, device, system, etc. A terminal may be used, for instance, to receive or provide analog or digital electrical signals (or simply signals) or to electrically connect to a common or ground reference. Accordingly, an input terminal or input is used to receive a signal from another component, device, system, etc. An output terminal or output is used to provide a signal to another component, device, system, etc. Other terminals may be used to connect to a common, ground, or voltage reference, e.g., a reference terminal or ground terminal. A terminal of an IC or a PCB may also be referred to as a pin (a longitudinal conductor) or a pad (a planar conductor). A node refers to a point of connection or interconnection of two or more terminals. An example number of terminals and nodes may be shown. However, depending on a particular circuit or system topology, there may be more or fewer terminals and nodes. However, in some instances, "terminal", "node", "interconnect", "pad", and "pin" may be used interchangeably.

Modifications are possible in the described embodiments, and other embodiments are possible, within the scope of the claims.

What is claimed is:

1. A circuit comprising:
    a switched capacitor circuit including:
        a first switch;
        a first capacitor having a first terminal coupled to the first switch and having a second terminal;
        a second switch;
        a second capacitor having a first terminal coupled to the second switch, and having a second terminal;
        a third switch having a first terminal coupled to the second terminals of the first and second capacitors, and having a second terminal; and
        a fourth switch having a first terminal coupled the first terminal of the third switch and to the second terminals of the first and second capacitors, the fourth switch having a second terminal; and
    a voltage generator circuit having an output coupled to the second terminal of the fourth switch, the voltage generator circuit configured to provide a common mode output bias voltage at the second terminal of the fourth switch responsive to a common mode input bias voltage at a terminal of the first switch, provide a first voltage at a second output, and provide a second voltage at a third output, in which:
        the first voltage is one or more diode drop voltages above the common mode output bias voltage; and
        the second voltage is one or more diode drop voltages below the common mode output bias voltage.

2. The circuit of claim 1, further comprising an integrator circuit including:
    an operational amplifier (op-amp) having an op-amp input and an op-amp output, the op-amp input coupled to the second terminal of the third switch; and
    a third capacitor coupled between the op-amp input and the op-amp output.

3. The circuit of claim 1, wherein the voltage generator circuit includes:
    a first divider element having first and second terminals;
    a second divider element having a first terminal coupled to the second terminal of the first divider element; and
    a common mode bias voltage generator circuit coupled to the second terminal of the first divider element and coupled to the first terminal of the second divider element, wherein the common mode bias voltage generator circuit is configured to provide the common mode output bias voltage at the second terminal of the fourth switch responsive to a voltage at the first terminal of the first divider element, in which the voltage is representative of the common mode input bias voltage.

4. The circuit of claim 3, wherein the common mode bias voltage generator circuit is configured to receive a divided common mode input bias voltage and to provide a buffered and lower impedance representation of the divided common mode input bias voltage as the common mode output bias voltage.

5. The circuit of claim 1, wherein the common mode output bias voltage is half the common mode input bias voltage.

6. The circuit of claim 1, further comprising an analog-to-digital converter (ADC) that includes the switched capacitor circuit and the voltage generator circuit as a first stage of the ADC.

7. The circuit of claim 6 in which the ADC is a delta-sigma ADC.

8. The circuit of claim 6, further comprising a multiplexer having battery voltage inputs and having an output coupled to an input of the ADC.

9. A circuit comprising:
    a first capacitor having first and second terminals;
    a second capacitor having first and second terminals, the second terminals of the first and second capacitors are coupled together, and the circuit is configured to receive an input voltage and a common mode input bias voltage at the first terminal of the first capacitor and to receive a reference voltage at the first terminal of the second capacitor;
    a voltage generator circuit having an output coupled to the second terminals of the first and second capacitors, wherein the voltage generator circuit is configured to provide a common mode output bias voltage at the second terminals of the first and second capacitors, and the common mode output bias voltage is based on the common mode input bias voltage;
    an analog-to-digital converter (ADC) having a first stage that includes a switched capacitor circuit and the voltage generator circuit; and
    a multiplexer having battery voltage inputs and a multiplexer output, wherein the multiplexer output is coupled to an input of the ADC.

10. The circuit of claim 9, wherein the common mode output bias voltage is half the common mode input bias voltage.

11. The circuit of claim 9, further comprising an integrator circuit including:
    an operational amplifier (op-amp) having an op-amp input and an op-amp output, wherein the op-amp input is coupled to a switch in the switched capacitor circuit; and
    a third capacitor coupled between the op-amp input and the op-amp output.

12. The circuit of claim 9, wherein the voltage generator circuit includes:
    a first divider element having first and second divider terminals;
    a second divider having third and fourth divider terminals, wherein the first third divider terminal is coupled to the second divider terminal; and
    a common mode bias voltage generator circuit coupled to second divider terminal and coupled to the third divider terminal, the common mode bias voltage generator circuit configured to provide the common mode output bias voltage to a switch in the switched capacitor circuit responsive to a voltage at the first divider terminal, in which the voltage is representative of the common mode input bias voltage, and the common mode bias voltage generator circuit is configured to provide a first voltage at a second output, and to provide a second voltage at a third output, in which the first voltage is one or more diode drop voltages above the common mode output bias voltage, and the second voltage is one or more diode drop voltages below the common mode output bias voltage.

13. The circuit of claim 12, wherein the common mode bias voltage generator circuit is configured to receive a divided common mode input bias voltage and to provide a buffered and lower impedance representation of the divided common mode input bias voltage as the common mode output bias voltage.

14. A system comprising:
first and second battery cells;
a multiplexer having multiplexer inputs coupled to the first and second battery cells, and having multiplexer outputs; and
an analog-to-digital converter (ADC) including:
a switched capacitor circuit including:
a first capacitor having first and second terminals;
first and second switches coupled between the multiplexer outputs and the first terminal of the first capacitor;
third and fourth switches;
a second capacitor having a first terminal coupled to the third and fourth switches and having a second terminal coupled to the second terminal of the first capacitor;
a fifth switch having a first terminal coupled to the second terminals of the first and second capacitors, and having a second terminal; and
a sixth switch having first and second terminals, wherein the first terminal is coupled to the first terminal of the fifth switch and coupled to the second terminals of the first and second capacitors;
an integrator circuit including:
an operational amplifier (op-amp) having an input and an output, the input of the op-amp coupled to the second terminal of the fifth switch; and a third capacitor coupled between the input and the output of the op-amp; and
a voltage generator circuit having a generator output coupled to the second terminal of the sixth switch, the voltage generator circuit configured to provide a common mode output bias voltage at the second terminal of the sixth switch responsive to a common mode input bias voltage at a terminal of the first switch.

15. The system of claim 14, wherein the ADC is a delta-sigma ADC that includes an analog modulator that includes the switched capacitor circuit, the integrator circuit, and the voltage generator circuit as a first stage of the analog modulator.

16. The system of claim 14, wherein the ADC is a successive-approximation register ADC.

17. The system of claim 14, wherein the common mode output bias voltage is half the common mode input bias voltage.

18. The system of claim 14, wherein the voltage generator circuit includes:
a first divider element having first and second terminals;
a second divider element having a first terminal coupled to the second terminal of the first divider element; and
a common mode bias voltage generator circuit having an input coupled to the second terminal of the first divider element and coupled to the first terminal of the second divider element, having a first output coupled to the second terminal of the sixth switch, having a second output coupled to the fifth and sixth switches, and having a third output coupled to the fifth and sixth switches, the common mode bias voltage generator circuit configured to:
provide the common mode output bias voltage at first output responsive to a voltage at the first terminal of the first divider element, in which the voltage is representative of the common mode input bias voltage;
provide a first voltage at the second output; and
provide a second voltage at the third output, in which the first voltage is one or more diode drop voltages above the common mode output bias voltage, and the second voltage is one or more diode drop voltages below the common mode output bias voltage.

* * * * *